United States Patent [19]

Jun

[11] Patent Number: 5,231,044
[45] Date of Patent: Jul. 27, 1993

[54] METHOD OF MAKING SEMICONDUCTOR MEMORY ELEMENTS

[75] Inventor: Young K. Jun, Seoul, Rep. of Korea

[73] Assignee: Goldstar Electron Co., Ltd., Cheongju, Rep. of Korea

[21] Appl. No.: 944,860

[22] Filed: Sep. 14, 1992

[30] Foreign Application Priority Data

Sep. 13, 1991 [KR] Rep. of Korea ............... 16002/1991

[51] Int. Cl.$^5$ ........................................... H01L 21/70
[52] U.S. Cl. ...................................... 437/52; 437/47; 437/48; 437/60; 437/919
[58] Field of Search ................ 437/47, 48, 52, 60, 437/919, 200; 257/303, 306, 307, 308

[56] References Cited

U.S. PATENT DOCUMENTS

| | | | |
|---|---|---|---|
| 5,061,650 | 10/1991 | Dennison et al. | 437/47 |
| 5,084,405 | 1/1992 | Fazan et al. | 437/47 |
| 5,155,057 | 10/1992 | Dennison et al. | 437/47 |

FOREIGN PATENT DOCUMENTS

| | | | |
|---|---|---|---|
| 0404553 | 12/1990 | European Pat. Off. | 437/52 |
| 0074752 | 3/1989 | Japan | 437/919 |
| 0091957 | 4/1991 | Japan | 437/52 |

OTHER PUBLICATIONS

N. Shinmura, et al., A Stacked Capacitor Cell with Ring Structure, Extended Abstracts of the 22nd (1990 International) Conference on Solid State Devices and Materials, Sendai, 1990, pp. 833-836.

*Primary Examiner*—Tom Thomas
*Attorney, Agent, or Firm*—Alan R. Loudermilk

[57] ABSTRACT

A method of making a semiconductor memory element such as in dynamic random access memories including forming a transistor on a semiconductor substrate, forming a polysilicon film, a metal silicide film and an oxide film, in this order, over the resultant entire exposed surface so as to form a bit line at the bit line contact, forming another oxide film over the resultant entire exposed surface and forming side wall spacers and a capacitor contact, depositing a first doped polysilicon film over the resultant entire exposed surface, and forming a first smoothing oxide film over the first doped polysilicon film. Over the resultant entire exposed surface, a nitride film is formed which has a thickness larger than that of the first doped polysilicon film by two times or more. A second smoothing oxide film is formed over the nitride film. The nitride film is etched using the smoothing oxide films as a mask. The method also includes depositing a second polysilicon film for a storage node and a third oxide film over the resultant entire exposed surface, etching the second doped polysilicon film using the first, second and third smoothing oxide films as a mask, forming a storage node, and forming a dielectric film for a capacitor and a plate node.

13 Claims, 9 Drawing Sheets

METHOD OF MAKING SEMICONDUCTOR MEMORY ELEMENTS

BACKGROUND OF THE INVENTION

1. Field of the Invention

The present invention relates to a method of making semiconductor memory elements, and more particularly to a method of making semiconductor memory elements such as in dynamic random access memories enabling simplified manufacture and increased capacitor area.

2. Description of the Prior Art

The development of manufacturing techniques for semiconductor elements has promoted the development of dynamic random access memories (DRAMs) of high capacitance as semiconductor memory elements. While early DRAMs had a planar structure, DRAMs have been transfigured to have three-dimensional storage capacitors with a stack or trench structure so as to maximize area efficiency. Recently, highly integrated DRAM cells primarily utilize stack structures because of the ease of manufacturing stack structures.

However, conventional stack-type DRAM cells have a limitation on the increase in capacitor are in that the bit lines of such cells typically are formed after the formation of transistors and capacitors, thus requiring area for contacting the bit lines with source/drain regions. Due to the provision of bit line contacts, such cells also are limited in the increase in storage node height, and thereby are limited on the possible increase in storage node area.

For solving these problems, a stack type DRAM cell capable of increasing the storage node area has been developed. In manufacturing such a DRAM cell, formation of the bit line and transistor precede the formation of the capacitor so that a storage node may be formed to extend to the bit line contact region.

FIGS. 1a to 1e are sectional views illustrating a method of making a semiconductor memory element having a crown type capacitor structure.

First, a process for forming a transistor of the semiconductor memory element will be described in conjunction with FIG. 1a. In accordance with this process, field oxide film 2 is first formed over semiconductor substrate 1, so as to define active regions. Over the surface thereof and over field oxide film 2, gate oxide film 3 is formed and a polysilicon film is deposited. The polysilicon film is in turn coated with photoresist and then subjected to photoetching so as to form a photoresist pattern defining gate regions. Using the photoresist pattern, the polysilicon film is etched to form gates 4. Thereafter, substrate 1 is then subjected to an impurity ion implantation to form source and drain regions 5. Over the resultant entire exposed surface, oxide film 6 is then deposited, so as to form transistors.

Referring to FIG. 1b, there is illustrated a process for forming a bit line. For forming a bit line contact, oxide film 6 partially is removed at portions at which a bit line is to be formed. Over the resultant entire exposed surface, doped polysilicon film 7 for the bit line is deposited, which is then subjected to an etch-back process for providing a smoothed surface.

Over smoothed polysilicon film 7 are deposited tungsten silicide (WSi$_2$) film 8 and oxide film 9 in this order. Thereafter, polysilicon film 7, tungsten silicide film 8 and oxide film 9 are subjected to patterning for formation of the bit line. After formation of the bit line, another oxide film is deposited over the resultant entire exposed surface and then subjected to an anisotropic dry etching process so that side wall spacers 10 are formed at opposite side surfaces of the bit line as illustrated in FIG. 1b. Side wall spacers 10 are oxide films for isolating the bit line from the storage and plate nodes of a capacitor to be formed in subsequent steps.

After completing the formation of the bit line as shown in FIG. 1b, semiconductor substrate has capacitor contacts 11 exposed in a self-aligned manner.

FIG. 1c illustrates plug forming and smoothing processes. As shown in FIG. 1c, a selective growth of a polysilicon film is carried out for forming plugs 12 only on capacitor contacts 11. Over the resultant entire exposed surface is coated nitride film 13, which is then subjected to etch-back and smoothing processes. Thereafter, oxide film 14 is formed over smoothed nitride film 13.

Referring to FIGS. 1d and 1e, a process for forming a capacitor will be described. First, both oxide film 14 and nitride film 13 are subjected to an anisotropic etching with a high etch selectivity so that these films remain only at portions disposed over the bit line and field oxide film, as shown in FIG. 1d. Subsequently, doped polysilicon film 15 for a storage node is deposited over the resultant entire exposed surface.

Over doped polysilicon film 15 is deposited another oxide film (not shown), which is, in turn, subjected to etch-back and smoothing processes so that portions of polysilicon film 15 on oxide film 14 are exposed. Using smoothed oxide film 14 as a mask, polysilicon film 15 is then etched back to remove portions thereof disposed on oxide film 14 so that oxide film 14 is exposed for forming a storage node, as shown in FIG. 1e. As the storage node is formed by etching the portion of polysilicon film 15 disposed on oxide film 14, it is separated from other storage nodes of neighboring cells. The storage node is disposed above the bit line and connected with source and drain regions 5 via plugs 12.

After formation of the storage node, exposed oxide film 14 is removed using a wet etching process. Over the resultant entire exposed surface, tantalum oxide film (Ta$_2$O$_5$) 16 is then formed so as to provide a dielectric film. Finally, a tungsten film is deposited over dielectric tantalum oxide film 16 so as to form plate node 17. Thus, a DRAM cell is produced. Such a conventional semiconductor memory element has a storage node having a single side wall structure as shown in FIG. 1e.

However, the above-described method of making a semiconductor memory element is complex in that it includes processes for forming nitride and oxide films and then patterning by anisotropically dry etching the films with a high etch selectivity so as to increase the height of the storage node of the capacitor, and also in that it includes a process for selectively forming a polysilicon plug at the capacitor contact so as to smooth the nitride film.

SUMMARY OF THE INVENTION

Therefore, an object of the present invention is to provide a method of making a semiconductor memory element capable of increasing the storage node area and thus the capacitor area.

Another object of the present invention is to provide a method of making a semiconductor memory element capable of using only a process for smoothing an oxide film and thus simplifying the manufacture of the semiconductor memory element.

In one aspect, the present invention provides a method of making a semiconductor memory element comprising the steps of: forming a field oxide film on a semiconductor substrate, so as to define an active region in the semiconductor substrate; forming a transistor at the active region, the transistor including a gate oxide film, a gate, source and drain regions and a gate insulating film; etching the gate insulating film so a to form a bit line contact; forming a polysilicon film, a metal silicide film and an oxide film, in this order, over the resultant entire exposed surface after the formation of the bit line contact, and patterning the polysilicon film, the metal silicide film and the oxide film to form a bit line at the bit line contact; forming another oxide film over the resultant entire exposed surface after the formation of the bit line and anisotropically dry etching the oxide film so as to form side wall spacers for the bit line and to form a capacitor contact; depositing a first doped polysilicon film for a storage node over the resultant entire exposed surface after the formation of the side wall spacers and the capacitor contact, the first doped polysilicon film being connected with the transistor via the capacitor contact; forming a first smoothing oxide film over the first doped polysilicon film and etching back the first smoothing oxide film so that it is smoothed; etching the first smoothing oxide film so as to expose portions of the first doped polysilicon film disposed over the bit line and the field oxide film; etching the exposed portions of the first doped polysilicon film; forming a nitride film over the resultant entire exposed surface after the etching of the first doped polysilicon film; forming a second smoothing oxide film over the nitride film and etching back the second smoothing oxide film until the nitride film is partially exposed s that the second smoothing oxide film is smoothed; etching the exposed portion of the nitride film; depositing a second doped polysilicon film for the storage node over the resultant entire exposed surface; forming a third smoothing oxide film over the second doped polysilicon film and etching back the third smoothing oxide film until the second doped polysilicon film is partially exposed and so that the third smoothing oxide film is smoothed; etching the exposed portion of the second doped polysilicon film; removing the remaining portions of the first and third smoothing oxide films so as to form the storage node; forming a dielectric film for a capacitor over the resultant entire exposed surface after formation of the storage node; and forming a plate node over the dielectric film.

In another aspect, the present invention provides a method of making a semiconductor memory element comprising the steps of: forming a field oxide film on a semiconductor substrate so as to define an active region in the semiconductor substrate; forming a transistor at the active region, the transistor including a gate oxide film, a gate, source and drain regions and a gate insulating film; etching the gate insulating film so as to form a bit line contact; forming a polysilicon film, a metal silicide film and an oxide film, in this order, over the resultant entire exposed surface after the formation of the bit line contact, and patterning the polysilicon film, the metal silicide film and the oxide film to form a bit line at the bit line contact; forming another oxide film over the resultant entire exposed surface after the formation of the bit line and anisotropically dry etching the oxide film so as to form side wall spacers for the bit line and to form a capacitor contact; depositing a first doped polysilicon film for a storage node over the resultant entire exposed surface after the formation of the side wall spacers and the capacitor contact, the first doped polysilicon film being connected with the transistor via the capacitor contact; forming a first smoothing oxide film over the first doped polysilicon film and etching back the first smoothing oxide film so that it is smoothed; etching the first smoothing oxide film so as to expose portions of the first doped polysilicon film disposed over the bit line and the field oxide film; etching the exposed portions of the first doped polysilicon film using the first smoothing oxide film as a mask; forming a nitride film over the resultant entire exposed surface after the etching of the first doped polysilicon film; forming a second smoothing oxide film over the nitride film and etching back the second smoothing oxide film until the nitride film is partially exposed and so that the second smoothing oxide film is smoothed; etching the exposed portion of the nitride film; depositing a second doped polysilicon film for the storage node over the resultant entire exposed surface; etching the exposed portion of the second doped polysilicon film; etching the remaining portions of the first and second smoothing oxide films so a to form the storage node; forming a dielectric film for a capacitor over the resultant entire exposed surface after formation of the storage node; and forming a plate node over the dielectric film.

BRIEF DESCRIPTION OF THE DRAWINGS

Other objects and aspects of the present invention will become apparent from the following description of embodiments with reference to the accompanying drawings in which.

DETAILED DESCRIPTION OF THE PREFERRED EMBODIMENT

Referring to FIGS. 2a to 2k, there is illustrated a method of making a semiconductor memory element having a storage node with a double side wall structure in accordance with an embodiment of the present invention.

Figure 1A:
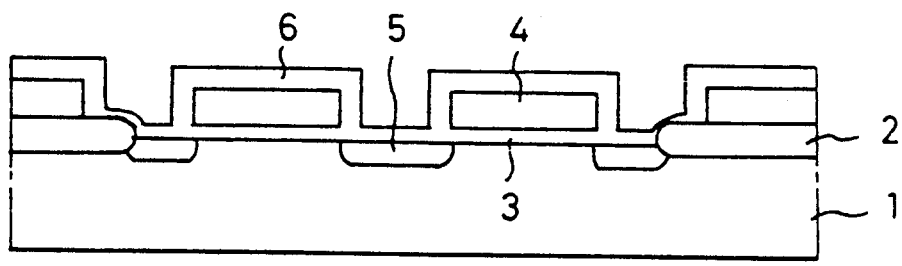
FIGS. 1a to 1e are sectional views illustrating a conventional method of making a semiconductor memory element.
Figure 1B:
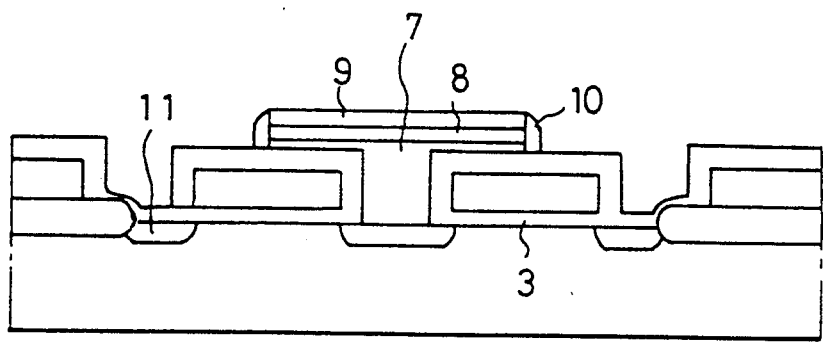
Figure 1C:
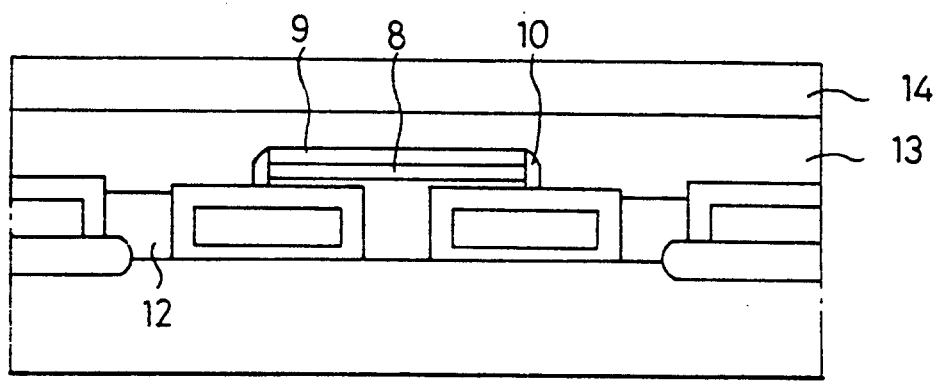
Figure 1D:
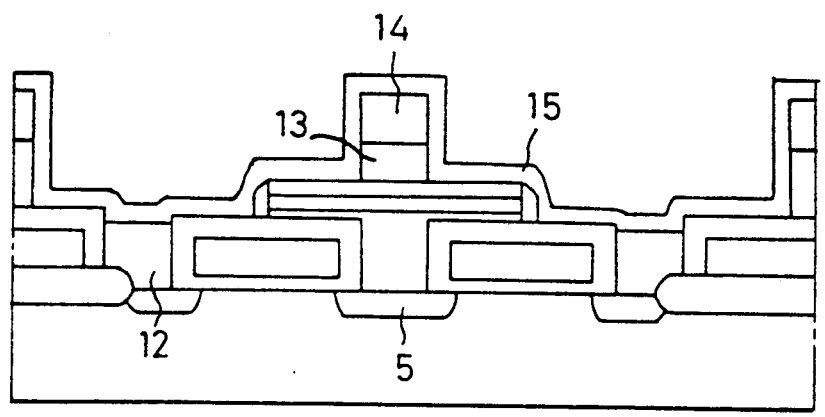
Figure 1E:
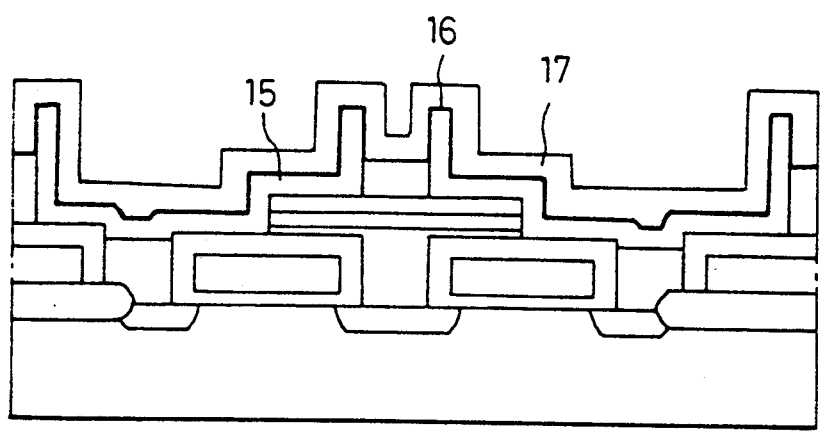
Figure 2A:
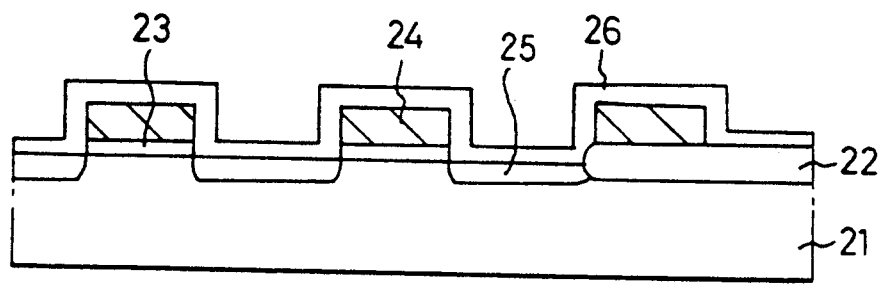
FIGS. 2a to 2k are sectional views illustrating a method of making a semiconductor memory element in accordance with a first embodiment of the present invention.

FIG. 2a is a sectional view illustrating a process for forming a transistor of the semiconductor memory element according to this embodiment of the present invention. In accordance therewith, semiconductor substrate 21 is first formed to have field oxide film 22, and gate oxide film 23 is formed and polysilicon film 24 is deposited in this order as shown. Polysilicon film 24 is then patterned to form a gate. Thereafter, substrate 21 is subjected to an impurity ion implantation to form source and drain regions 25. Over the resultant entire exposed surface, oxide film 26 for providing gate insulation is then deposited so as to form a transistor.

Figure 2B:
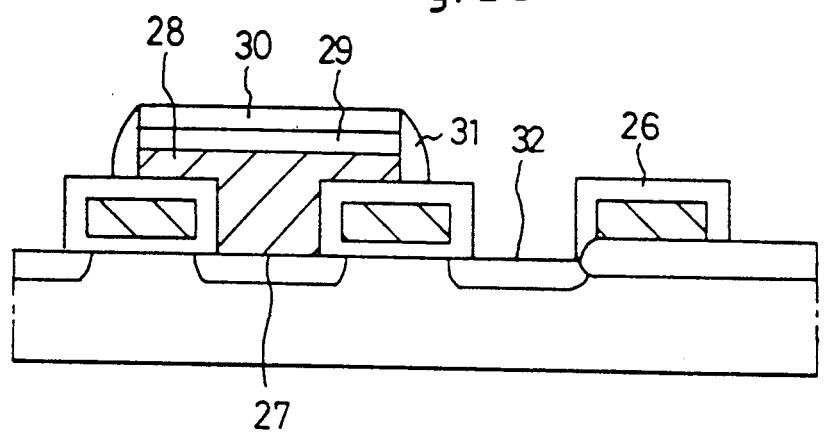

Referring to FIG. 2b, there is illustrated a process for forming a bit line. Gate insulating oxide film 26 is removed at portions on which a bit line is to be formed, so as to expose portions of semiconductor substrate 21 corresponding to the removed portions of gate insulating oxide film 26. The exposed portion of semiconductor substrate 21 provides bit line contact 27.

Over the resultant entire exposed surface, polysilicon film 28 for a bit line is deposited, which is then subjected to an etch-back process for providing smoothness. Over the resultant entire exposed surface are formed metal silicide film 29, having a high melting point, and oxide film 30, in this order. Thereafter, oxide film 30, metal silicide film 29 and polysilicon film 28 are subjected to patterning processes for forming a bit line connected to bit line contact 27 as shown.

After the formation of the bit line, another oxide film is deposited over the resultant entire exposed surface and then subjected to an anisotropic dry etching so that side wall spacers 31 ar formed at opposite side surfaces of the bit line.

With the process for forming the bit line described above with reference to FIG. 2b, capacitor contact 32 also is formed in a self-aligned manner.

FIGS. 2c to 2j illustrate a process for forming a storage node of a capacitor.

Figure 2C:
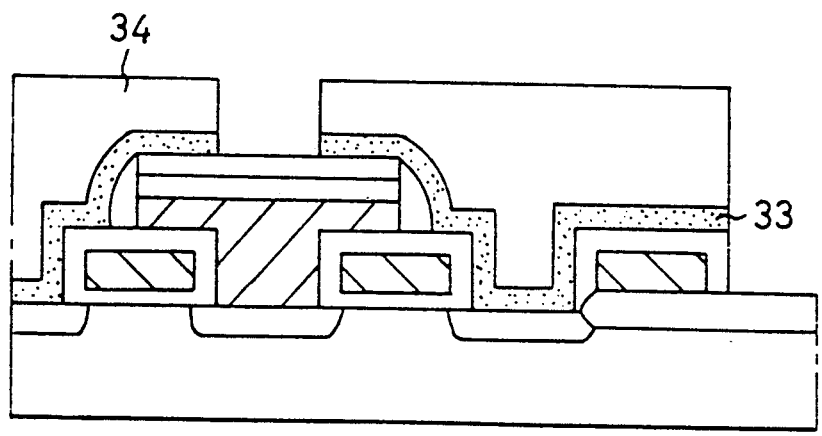

As shown in FIG. 2c, first doped polysilicon film 33 is deposited over the entire exposed surface of semiconductor substrate 21 having capacitor contact 32. First doped polysilicon film 33 is connected with the transistor via capacitor contact 32. Over first doped polysilicon film 33 is formed first smoothing oxide film 34, which is then etched back so as to be smoothed.

Thereafter, first smoothing oxide film 34 is removed at portions disposed over the bit line and field oxide film 22 so as to expose partially first doped polysilicon film 33. Using patterned first smoothing oxide film 34 as a mask, the exposed portions of first doped polysilicon film 33 are removed by an etching process as shown in FIG. 2c.

Figure 2D:
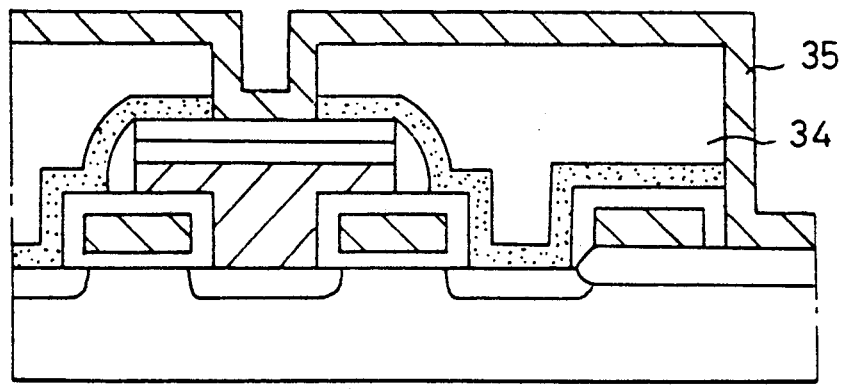
Figure 2E:
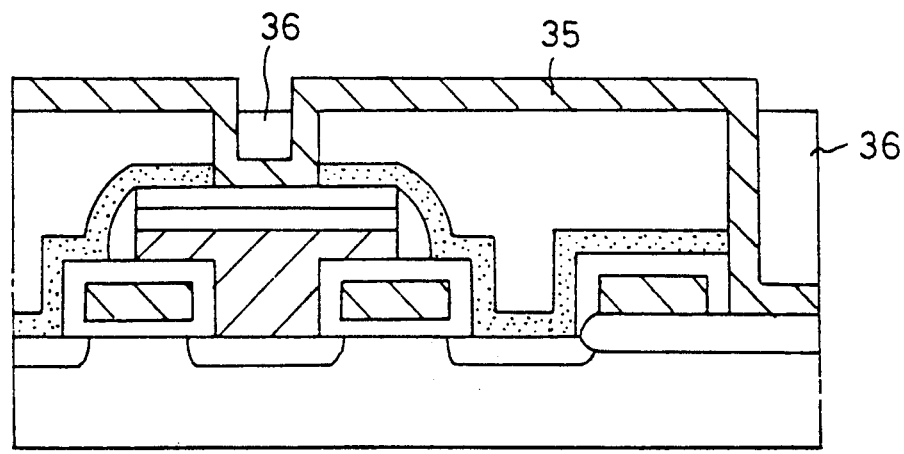

As shown in FIG. 2d, nitride film 35 is then formed over the resultant entire exposed surface. Nitride film 35 has a thickness larger than that of first doped polysilicon film 33 by two times or more.

Over nitride film 35 is formed second smoothing oxide film 36, which is then etched back and smoothed for exposing partially the upper surface of nitride film 35. First smoothing oxide film 34 comprises a spin on glass (SOG) film or multi-layer film including a SOG film and a chemical vapor deposition (CVD) oxide film, whereas second smoothing oxide film 36 comprises a SOG film.

Figure 2F:
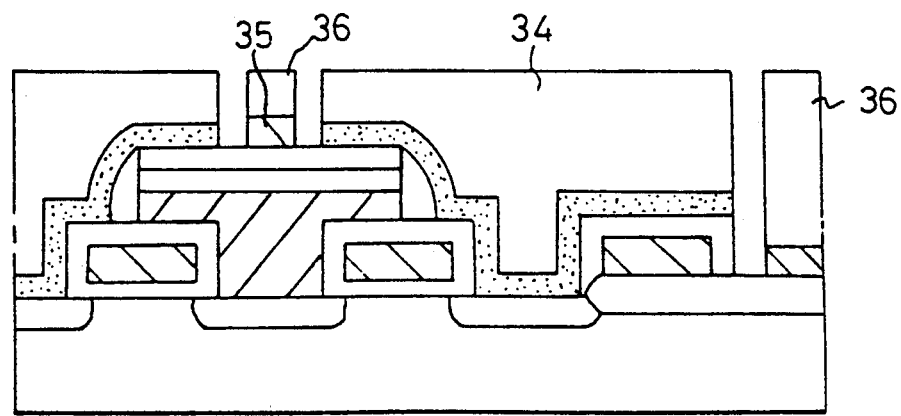

Under the condition of using first and second smoothing oxide films 34 and 36, respectively, as a mask, the exposed portions of nitride film 35 are then removed by using an anisotropic dry etching method, as shown in FIG. 2f.

Figure 2G:
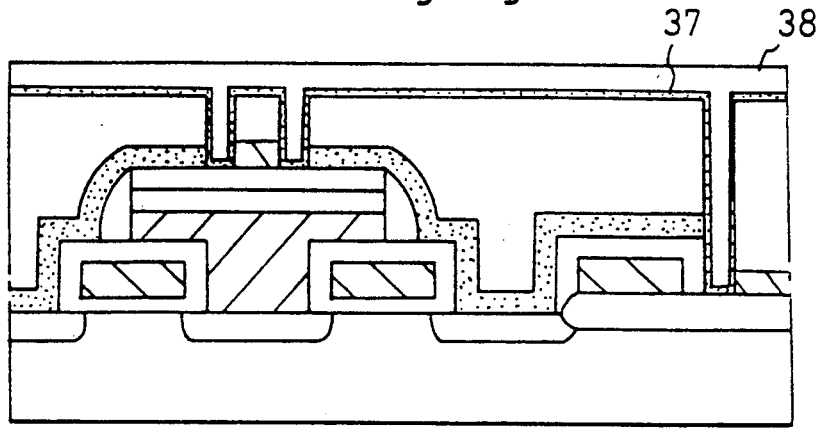

Over the resultant entire exposed surface is deposited second doped polysilicon film 37 for the storage node and third smoothing oxide film 38, in this order, as shown in FIG. 2g.

Figure 2H:
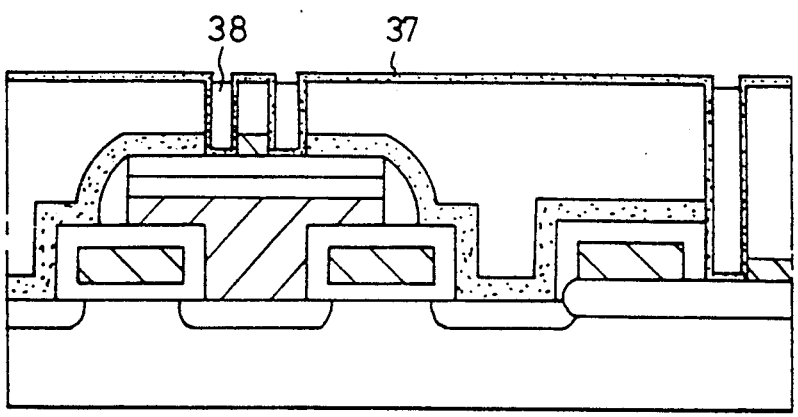

Thereafter, third smoothing oxide film 38 is etched back and smoothed until second doped polysilicon film 37 is exposed, as shown in FIG. 2h.

Figure 2I:
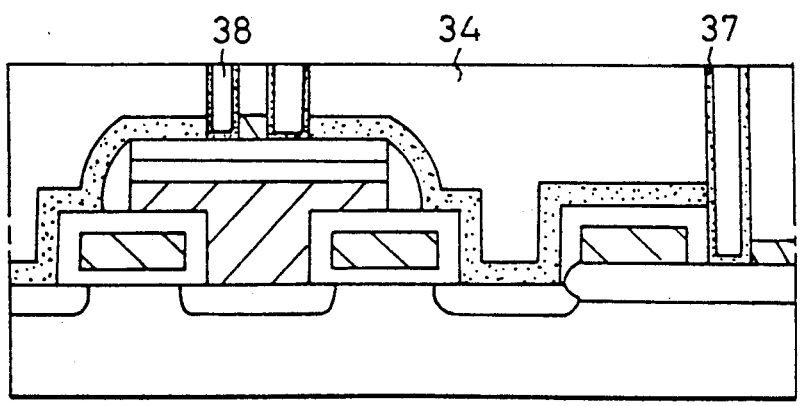

Under the condition of using first and third smoothing oxide films 34 and 38, respectively, as a mask, second doped polysilicon film 37 is then removed at selected portions by using an anisotropic dry etching method, as shown in FIG. 2i.

Figure 2J:
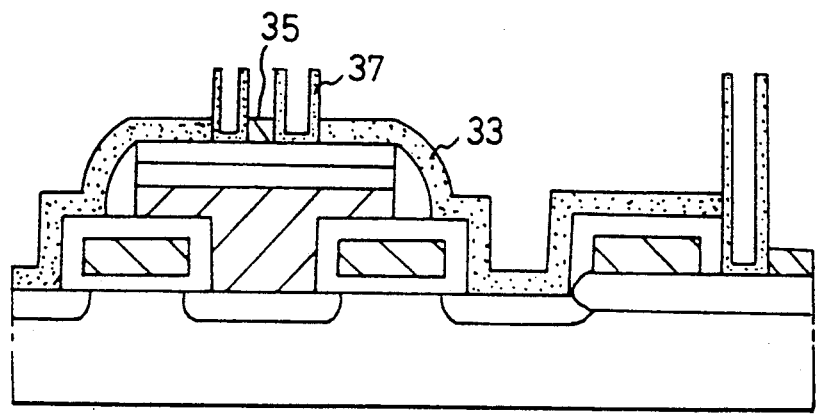

As shown in FIG. 2j, remaining first, second and third smoothing oxide films 34, 36 and 38, respectively, are removed using a wet etching method, thereby forming a storage node having a double side wall structure.

Figure 2K:
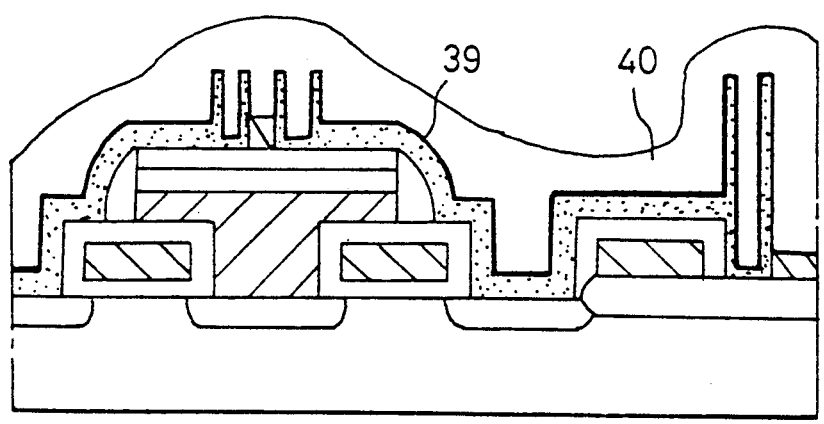

Finally, dielectric film 39 for a capacitor is formed over the resultant entire exposed surface, as shown in FIG. 2k. On dielectric film 39 is then formed plate node 40. Thus, a capacitor is produced.

In the semiconductor memory element produced by the first embodiment of the present invention, the storage node of the capacitor has a double side wall structure, thereby increasing its area.

FIGS. 3a to 3i are sectional views illustrating a method of making a semiconductor memory element in accordance with a second embodiment of the present invention.

Figure 3A:
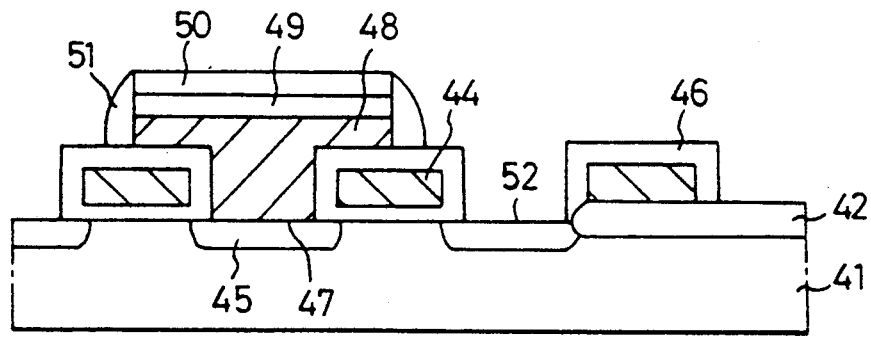
FIGS. 3a to 3i are sectional views illustrating a method of making a semiconductor memory element in accordance with a second embodiment of the present invention.

FIG. 3a is a sectional view illustrating a process for forming a transistor and a bit line of the semiconductor memory element according to the second embodiment of the present invention. The process is the same as the process of the first embodiment of the present invention. On semiconductor substrate 41 having field oxide film 42 is formed a transistor which comprises gate oxide film 43, gate 44, source and drain regions 45 and gate insulating oxide film 46. The exposed portion of semiconductor substrate 41 provides for bit line contact 47. Over bit line contact 47 are formed polysilicon film 48 for a bit line, metal silicide film 49, having a high melting point, and oxide film 50, in this order. A pair of side wall spacers 51 are then formed at opposite side surfaces of the bit line.

By the process for forming the bit line, capacitor contact 52 also is formed in a self-aligned manner.

FIGS. 3b to 3h illustrate a process for forming a storage node of a capacitor.

Figure 3B:
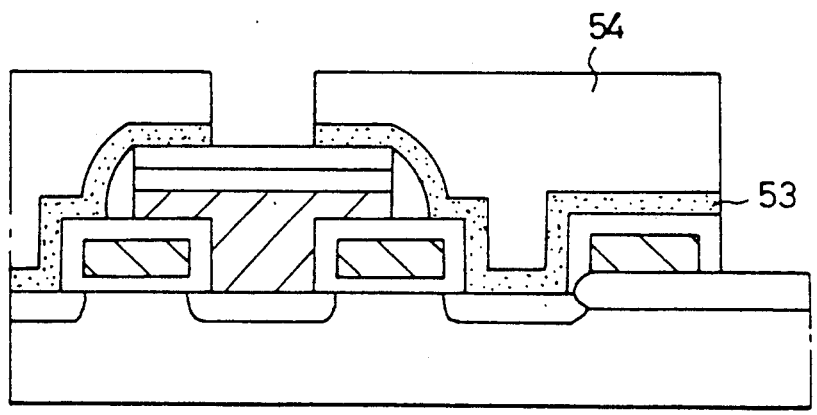

As shown in FIG. 3b, first doped polysilicon film 53 for a storage node is deposited over the entire exposed surface of semiconductor substrate 41. Over first doped polysilicon film 53 is formed first smoothing oxide film 54, which is then etched back so as to be smoothed.

Thereafter, first smoothing oxide film 54 is removed at portions disposed over the bit line and field oxide film 42 so as to expose partially first doped polysilicon film 53. Using first smoothing oxide film 54 as a mask, the exposed portions of first doped polysilicon film 53 are removed by an etching process.

Figure 3C:
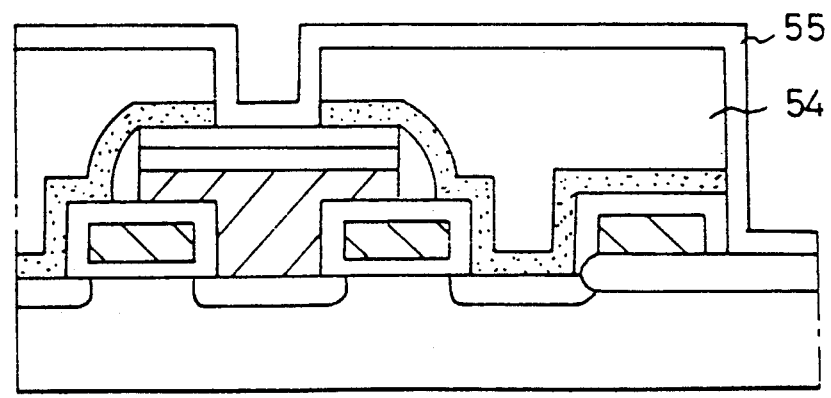

As shown in FIG. 3c, nitride film 55 is then formed over the resultant entire exposed surface. Nitride film 55 has a thickness larger than that of first doped polysilicon film 53 by two times or less.

Figure 3D:
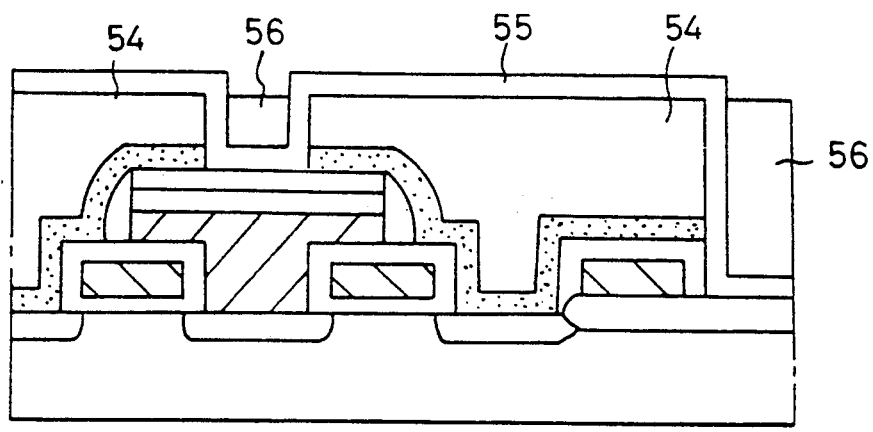

Over nitride film 55 is formed second smoothing oxide film 56, which is then etched back and smoothed for exposing partially the upper surface of nitride film 55, as shown in FIG. 3d.

Figure 3E:
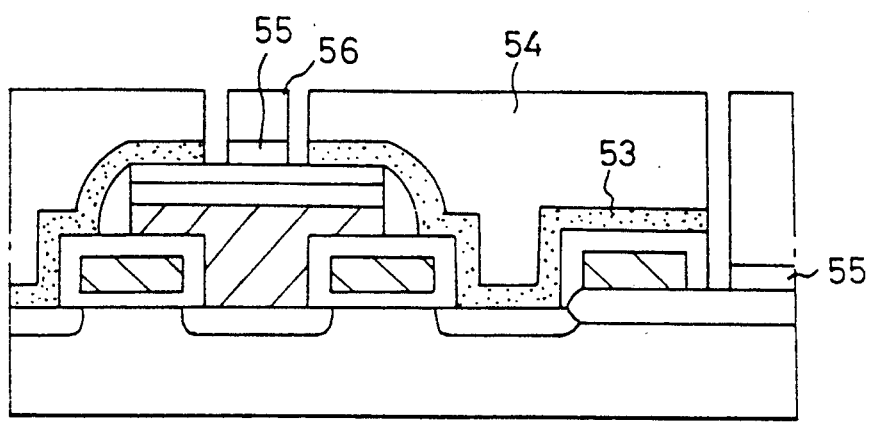

Under the condition of using first and second smoothing oxide films 54 and 56, respectively, as a mask, the exposed portions of nitride film 55 are then removed by using an anisotropic dry etching method, as shown in FIG. 3e.

Figure 3F:
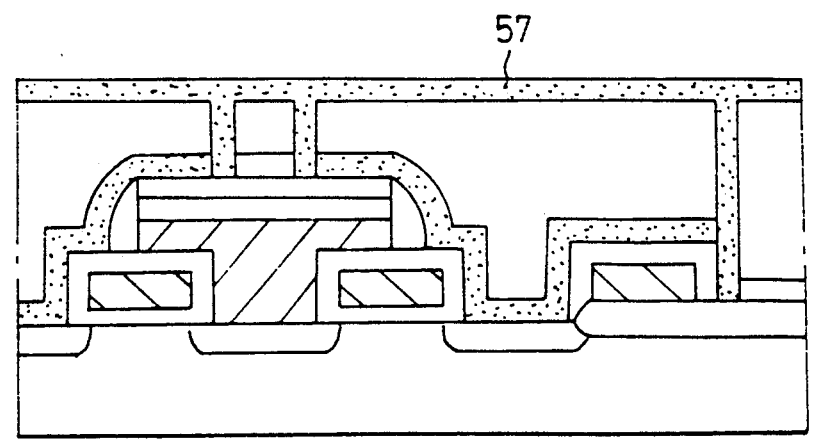
Figure 3G:
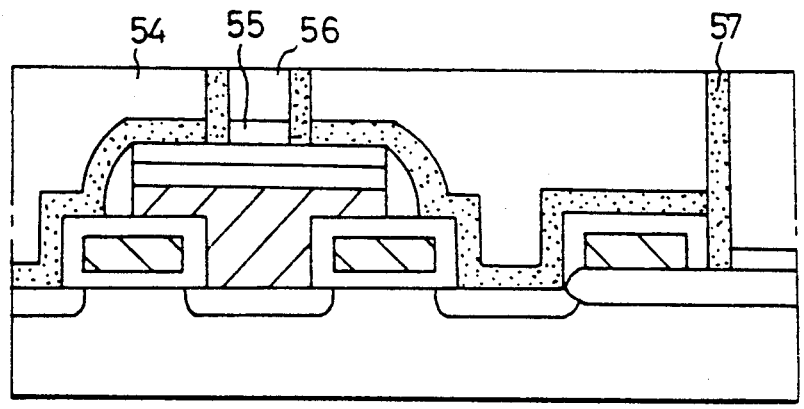

Over the resultant entire exposed surface is deposited second doped polysilicon film 57 for the storage node, as shown in FIG. 3f. Under the condition of using first and second smoothing oxide films 54 and 56, respectively, as a mask, second doped polysilicon film 57 is then etched back to be removed at selected portions, as 15 shown in FIG. 3g.

Figure 3H:
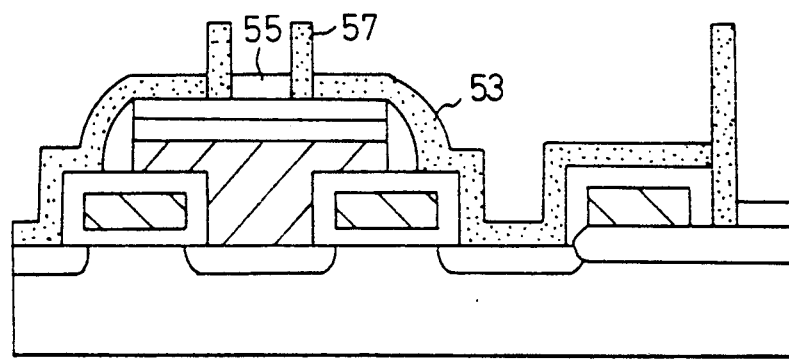

As shown in FIG. 3h, remaining first and second smoothing oxide films 54 and 56, respectively, are removed using a wet etching process, thereby forming a storage node having a single side wall structure.

Figure 3I:
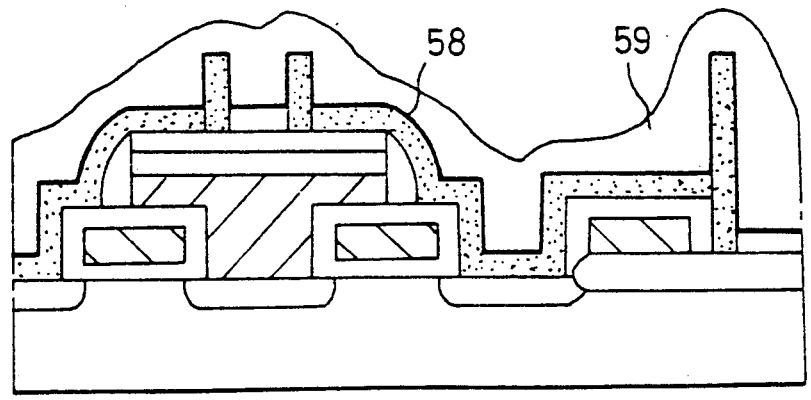

Finally, dielectric film 58 for a capacitor is formed over the resultant entire exposed surface, as shown in FIG. 3i. On dielectric film 58 is then formed plate node 59. Thus, a capacitor is produced.

The above-mentioned methods in accordance with the present invention provide the following effects.

First, while the prior art processes typically involve smoothing both the oxide and nitride films and then etching them with a high etch selectivity for the purpose of forming a pattern capable of increasing the storage node height, the processes of the present invention involve smoothing only an oxide film for this purpose.

Second, while the prior art processes typically require formation of a polysilicon plug on a capacitor contact for the purpose of smoothing the nitride film, the processes of the present invention have n such requirement by virtue of smoothing only an oxide film, thereby proving an advantage in that the manufacture of the semiconductor memory element is simplified.

Finally, the processes of the present invention utilize a self-aligning patterning process for forming a storage node having a double side wall structure, thereby resulting in an increase of storage node area.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of making a semiconductor memory element comprising the steps of:

forming a field oxide film on a semiconductor substrate to define an active region in the semiconductor substrate;

forming a transistor at the active region, the transistor having a gate oxide film, a gate, source and drain regions and a gate insulating film;

etching the gate insulating film to form a bit line contact with the source region;

forming a polysilicon film, a metal silicide film and a first oxide film, in this order, on the exposed surface, and patterning the polysilicon film, the metal silicide film and the first oxide film to form a bit line connected to the source region through the bit line contact;

forming a second oxide film on the exposed surface and anisotropically dry etching the second oxide film to form side wall spacers for the bit line and to form a capacitor contact with the drain region;

depositing a first doped polysilicon film for a storage node on the exposed surface, the first doped polysilicon film being connected with the drain region of the transistor through the capacitor contact;

forming a first smoothing oxide film on the first doped polysilicon film and etching back the first smoothing oxide film to smooth the surface thereof;

etching the first smoothing oxide film to expose portions of the first doped polysilicon film disposed over the bit line and the field oxide film;

etching the exposed portions of the first doped polysilicon film;

forming a nitride film on the exposed surface;

forming a second smoothing oxide film on the nitride film and etching back the second smoothing oxide film to smooth the surface thereof and to expose partially the nitride film;

etching the exposed portion of the nitride film;

depositing a second doped polysilicon film for the storage node on the exposed surface;

forming a third smoothing oxide film on the second doped polysilicon film and etching back the third smoothing oxide film to smooth the surface thereof and to expose partially the second doped polysilicon film;

etching the exposed portion of the second doped polysilicon film, wherein portions of the second doped polysilicon film remain and are connected to the remaining portions of the first doped polysilicon layer;

removing the remaining portions of the first and third smoothing oxide films to form the storage node;

forming a dielectric film for a capacitor on the exposed surface; and forming a plate node on the dielectric film.

2. The method of claim 1, wherein the first smoothing oxide film comprises a spin on glass, SOG, film or a multi-layer film including a SOG film and a chemical vapor deposition oxide film.

3. The method of claim 1, wherein the step of etching the first doped polysilicon film is conducted using the first smoothing oxide film as a mask.

4. The method of claim 1, wherein the nitride film has a thickness greater than the thickness of the first doped polysilicon film by two times or more.

5. The method of claim 1, wherein the step of etching the nitride film is conducted with an anisotropic dry etch method using the first and second smoothing oxide films as mask.

6. The method of claim 1, wherein the second smoothing oxide film comprises a SOG film.

7. The method of claim 1, wherein the step of etching the second doped polysilicon film is conducted with an anisotropic dry etch method using the first, second and third smoothing oxide films as a mask.

8. The method of claim 1, wherein the steps of etching the first, second and third smoothing oxide films is conducted using wet etching methods.

9. The method of claim 1, wherein the storage node has a double side wall structure.

10. A method of making a semiconductor memory element comprising the steps of:

forming a field oxide film on a semiconductor substrate to define an active region in the semiconductor substrate;

forming a transistor at the active region, the transistor having a gate oxide film, a gate, source and drain regions and a gate insulating film;

etching the gate insulating film to form a bit line contact with the source region;

forming a polysilicon film, a metal silicide film and a first oxide film, in this order, on the exposed surface, and patterning the polysilicon film, the metal silicide film and the first oxide film to form a bit line connected to the source region through the bit line contact;

forming a second oxide film on the exposed surface, and anisotropically dry etching the second oxide film to form side wall spacers for the bit line and to form a capacitor contact with the drain region;

depositing a first doped polysilicon film for a storage node on the exposed surface, the first doped polysilicon film being connected with the drain region of the transistor through the capacitor contact;

forming a first smoothing oxide film on the first doped polysilicon film and etching back the first smoothing oxide film to smooth the surface thereof;

etching the first smoothing oxide film to expose portions of the first doped polysilicon film disposed over the bit line and the field oxide film;

etching the exposed portions of the first doped polysilicon film using the first smoothing oxide film as a mask;

forming a nitride film on the exposed surface;

forming a second smoothing oxide film on the nitride film and etching back the second smoothing oxide film to smooth the surface thereof and to expose partially the nitride film;

etching the exposed portion of the nitride film;

depositing a second doped polysilicon film for the storage node on the exposed surface;

etching the exposed portion of the second doped polysilicon film, wherein portions of the second doped polysilicon film remain and are connected to the remaining portions of the first doped polysilicon layer;

etching the remaining portions of the first and second smoothing oxide films to form the storage node;

forming a dielectric film for a capacitor on the exposed surface; and forming a plate node on the dielectric film.

11. The method of claim 10, wherein the nitride film has a thickness greater than the thickness of the first doped polysilicon film by two times or less.

12. The method of claim 10, wherein the step of etching the second doped polysilicon film is selectively carried out using an etch-back method using the first and second smoothing oxide films as a mask.

13. The method of claim 10, wherein the storage node has a single side wall structure.

* * * * *